US008188737B2

(12) United States Patent
Saha

(10) Patent No.: US 8,188,737 B2
(45) Date of Patent: May 29, 2012

(54) MRI COMPATIBLE RADIO FREQUENCY (RF) COIL, WITH EACH RUNG OF THE RF COIL CONTAINING A PLURALITY OF INDIVIDUAL PARALLEL WIRES INTERNALLY

(75) Inventor: Saikat Saha, Florence, SC (US)

(73) Assignee: General Electric Company, Schenectady, NY (US)

(*) Notice: Subject to any disclaimer, the term of this patent is extended or adjusted under 35 U.S.C. 154(b) by 293 days.

(21) Appl. No.: 12/329,093

(22) Filed: Dec. 5, 2008

(65) Prior Publication Data
US 2010/0141258 A1    Jun. 10, 2010

(51) Int. Cl.
*G01V 3/00* (2006.01)
(52) U.S. Cl. ............... 324/318; 324/322; 324/307
(58) Field of Classification Search ........ 324/300–322; 333/219; 600/407–435; 382/128–131
See application file for complete search history.

(56) References Cited

U.S. PATENT DOCUMENTS

| 6,285,189 | B1* | 9/2001 | Wong ........................ 324/318 |
| 6,377,047 | B1* | 4/2002 | Wong et al. .................. 324/318 |
| 6,661,229 | B2* | 12/2003 | Weyers et al. ............... 324/318 |
| 7,081,753 | B2* | 7/2006 | Mullen et al. ............... 324/318 |
| 7,102,350 | B2* | 9/2006 | Weyers et al. ............... 324/318 |
| 7,733,088 | B2* | 6/2010 | Cho et al. ..................... 324/318 |
| 2002/0158720 | A1* | 10/2002 | Weyers et al. ............... 333/219 |
| 2003/0193380 | A1* | 10/2003 | de Swiet et al. ............. 333/219 |
| 2005/0275403 | A1* | 12/2005 | Pinkerton et al. ............ 324/318 |
| 2006/0001425 | A1* | 1/2006 | Weyers et al. ............... 324/318 |
| 2010/0141258 | A1* | 6/2010 | Saha ............................ 324/318 |

OTHER PUBLICATIONS

Grafendorfer et al, Optimized Litz Coil Design for Prepolorized Extremity MRI, Proc. Intl. Mag. Reson. Med. 14 (2006), p. 2613.
Grafendorfer et al, A Prepolorized MRI Knee Scanner, Proc. Intl. Soc. Mag. Reson. Med. 15 (2007), p. 923.
Savelainen et al, Signal to Noise Ratio of a NMR Experiment at 0.02 T, Proc. Soc. Mag. Reson. Med. 6 (1987), p. 840.

* cited by examiner

*Primary Examiner* — Melissa Koval
*Assistant Examiner* — Tiffany Fetzner
(74) *Attorney, Agent, or Firm* — The Small Patent Law Group; Dean D. Small

(57) ABSTRACT

A radio frequency (RF) coil for a magnetic resonance imaging (MRI) system includes a plurality of rungs. Each rung includes a plurality of wires positioned parallel to one another. Each wire has a circular cross section and an insulating material disposed around an outside surface of the wire. Using wires with a circular cross-section reduces the eddy currents produced on a rung. As a result, the amount of eddy current produced heating, vibration and acoustic noise is reduced. The plurality of wires also enables a more uniform current distribution along the width of each rung that in turn produces a more uniform excitation field (B1).

19 Claims, 6 Drawing Sheets

MRI COMPATIBLE RADIO FREQUENCY (RF) COIL, WITH EACH RUNG OF THE RF COIL CONTAINING A PLURALITY OF INDIVIDUAL PARALLEL WIRES INTERNALLY

FIELD OF THE INVENTION

The present invention relates generally to a magnetic resonance imaging (MRI) system and in particular to a radio frequency (RF) coil configured to reduce heating, vibration and acoustic noise.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

As mentioned, radio frequency (RF) coils are used in an MRI system to transmit RF excitation signals and to receive MR signals emitted by an imaging subject. Various types of RF coils may be used in an MRI system such as a whole-body RF coil and RF surface (or local) coils. Two common RF coil configurations are the birdcage coil and the transverse electromagnetic (TEM) coil.

During an MRI scan, acoustic noise and vibration can be generated in the patient bore. The acoustic noise and vibration can be uncomfortable and potentially harmful to both the patient and scanner operator. There are several sources of acoustic noise in an MRI system including, for example, the gradient coils and the RF coils. The acoustic noise generated by the RF coil is typically caused by eddy currents induced in the RF coil conductors by operation of the gradient coils. In particular, current pulses are applied (e.g., as part of a pulse sequence) to the gradient coils to generate time-varying magnetic fields. These time-varying magnetic fields can induce eddy currents in an RF coil that cause motion or vibration of the RF coil and result in acoustic noise. In addition, the eddy currents induced in the RF coils can produce heating. The heat produced by the RF coils can cause an increase in the temperature of the patient bore which can affect patient comfort and the efficiency of the MRI system.

It would be desirable to provide an RF coil configured to reduce or eliminate heating, vibration and acoustic noise generated by the RF coil. It would also be desirable to provide an RF coil configured to produce a uniform excitation (B1) field.

BRIEF DESCRIPTION OF THE INVENTION

In accordance with an embodiment, a radio frequency (RF) coil for a magnetic resonance imaging (MRI) system includes a plurality of rungs where each rung includes a plurality of wires positioned parallel to one another, each wire having a circular cross section and each wire having an insulating material disposed around an outside surface of the wire.

In accordance with another embodiment, a resonance assembly for a magnetic resonance imaging (MRI) system includes a magnet, a gradient coil assembly disposed within an inner diameter of the magnet and a radio frequency (RF) coil disposed within an inner diameter of the gradient coil assembly, the RF coil including a plurality of rungs, where each rung includes a plurality of wires positioned parallel to one another, each wire having a circular cross section and each wire having an insulating material disposed around an outside surface of the wire.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

A radio frequency (RF) coil is described herein having a set of rungs (or legs, conductive elements) where each rung includes a plurality of individually insulated parallel wires. Each individually insulated wire has a circular cross section. Using wires with a circular cross-section reduces the eddy currents produced on a rung. As a result, the amount of eddy current produced heating, vibration and acoustic noise is reduced. The plurality of wires also enables a more uniform current distribution along the width of each rung that in turn produces a more uniform excitation field (B1). A more uniform excitation field (B1) is particularly useful for imaging applications at high fields. The RF coil design described herein may be used for various coil configurations such as birdcage coils or transverse electromagnetic (TEM) coils. The RF coil design can also be used for various types of RF coils such as whole-body coils or surface (or local) coils and for transmitting and/or receiving signals.

Figure 1:
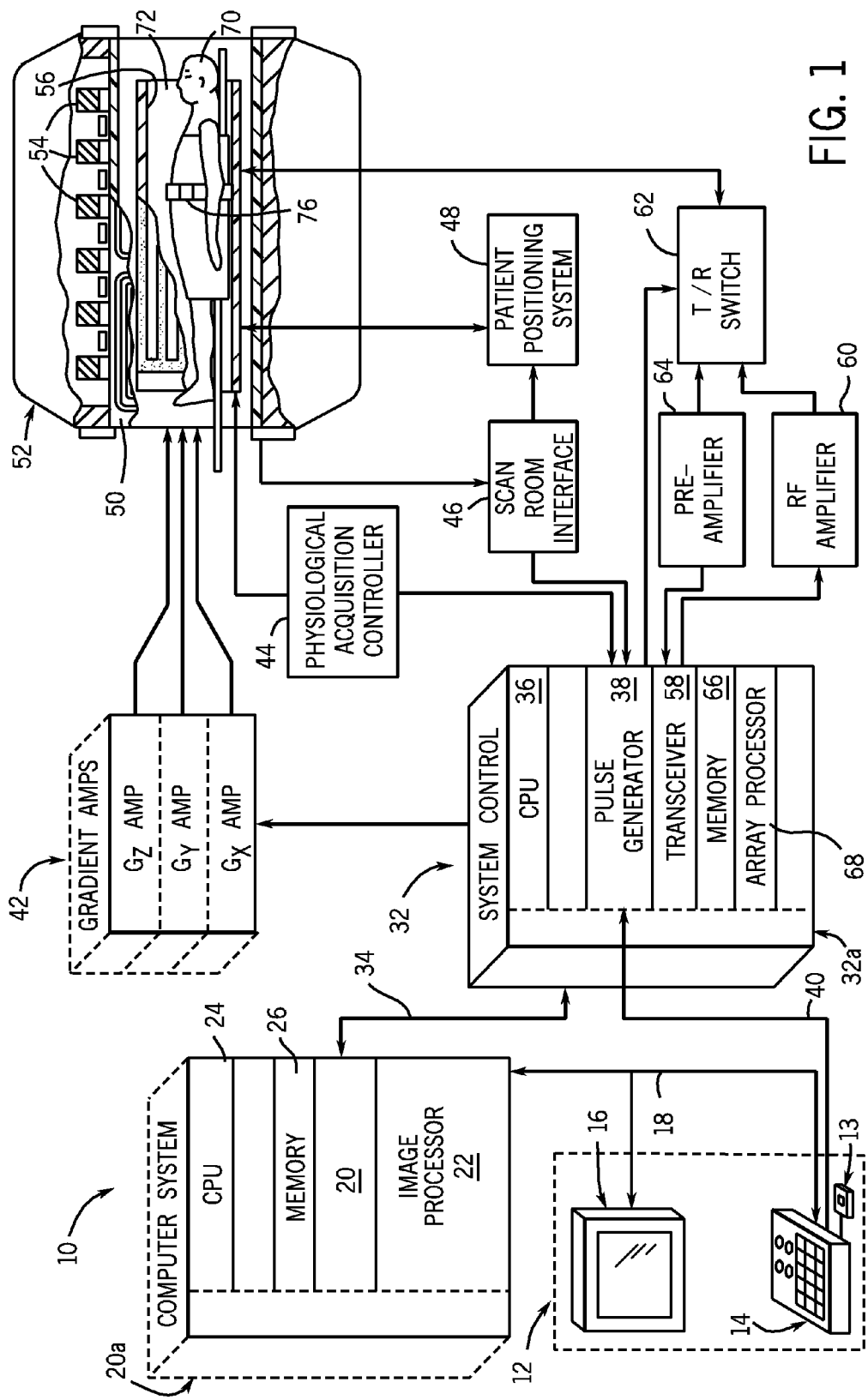
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
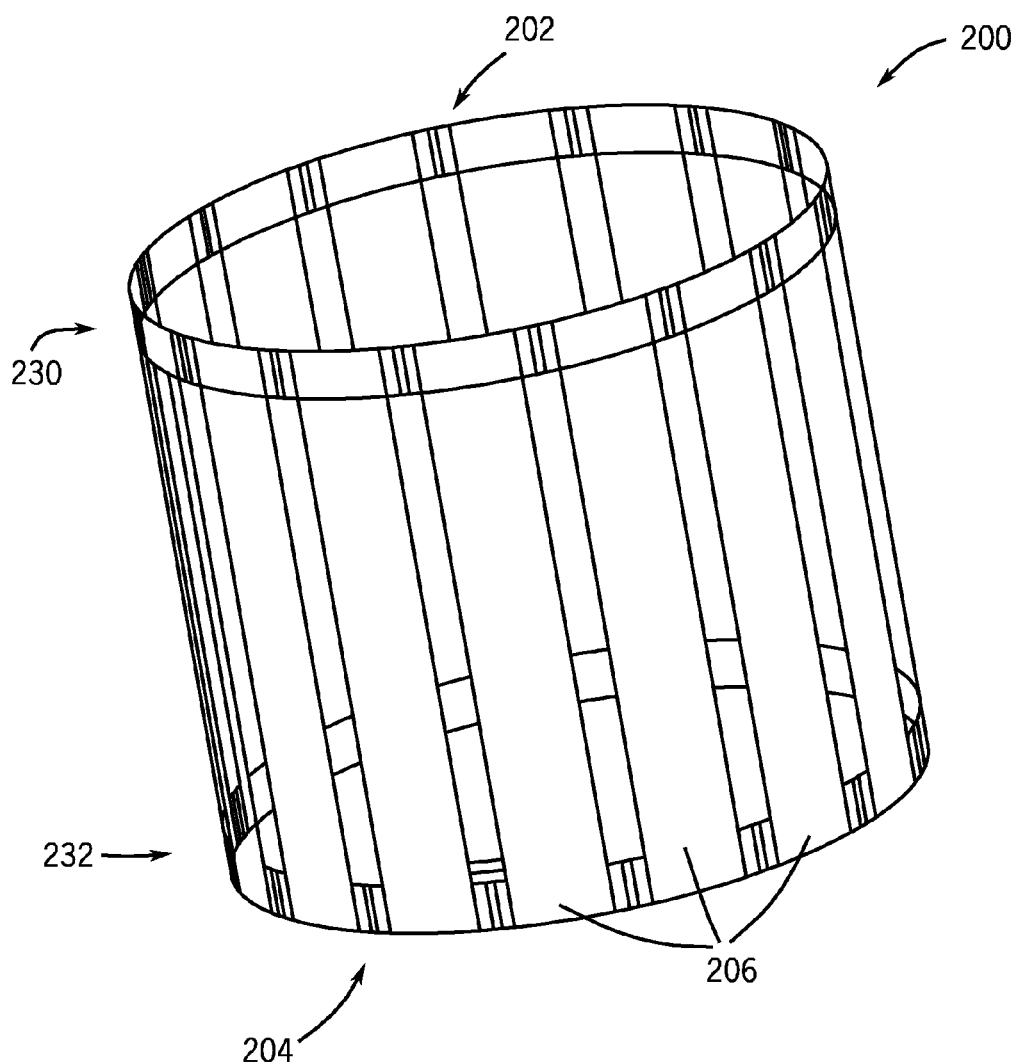
FIG. 2 is a perspective view of a radio frequency (RF) coil in accordance with an embodiment.

As mentioned, RF coils (for example, RF body coil 56 and a surface coil or coils 76 (e.g., an array of surface coils)) may be used to transmit RF excitation pulses (to generate an excitation field (B1)) and/or to receive MR signals. FIG. 2 is a perspective view of an RF coil in accordance with an embodiment. The RF coil 200 shown in FIG. 2 is a birdcage configuration. While the following description will be in reference to the birdcage coil in FIG. 2, it should be understood that the rung configuration described below with respect to FIGS. 3-7 can be used in other coil configurations using rungs such as a transverse electromagnetic (TEM) coil. RF coil 200 is cylindrical and annular in shape and is compatible with the above-described MRI system of FIG. 1 or any other similar or equivalent system for obtaining MR images. The RF coil 200 configuration shown in FIG. 2 may be used for a whole-body RF coil or for a surface (or local) coil such as a head coil. For a whole-body RF coil, the dimensions of the RF coil 200 are configured so that the RF coil can be mounted inside a gradient coil assembly 50 (shown in FIG. 1) in a spaced apart coaxial relationship. For a surface or local coil (e.g., a head coil), the dimensions of RF coil 200 are configured so that the RF coil can be disposed within the patient imaging space 72 (shown in FIG. 1).

The RF coil 200 shown in FIG. 2 includes, among other elements, a first end ring 202, a second end ring 204 and a plurality of rungs (or legs, conductor elements) 206. The first end ring 202 is located at a first end 230 of the plurality of rungs 206. The second end ring 204 is located at a second end 232 of the plurality of rungs 206. The first end ring 202 and the second end ring 204 oppose one another in a spaced-apart relationship and are connected by the plurality of rungs 206. An exemplary number of rungs 206 are shown in FIG. 2. Fewer or more rungs may be used based on the requirements of a particular imaging application, for example, based on the field of view (FOV), image resolution, power requirements and imaging speed. The rungs 206 are arranged cylindrically and can be, for example, uniformly spaced from one another. Each end ring 202, 204 also includes a plurality of capacitors (for example, low inductance end ring capacitors) that electrically connect the rungs 206. Rungs 206 and end rings 202, 204 are constructed from conventional materials with high electrical conductivity such as copper. Rungs 206 each include a plurality of parallel circular cross-section wires as described in more detail below with respect to FIGS. 3-7.

Figure 3:
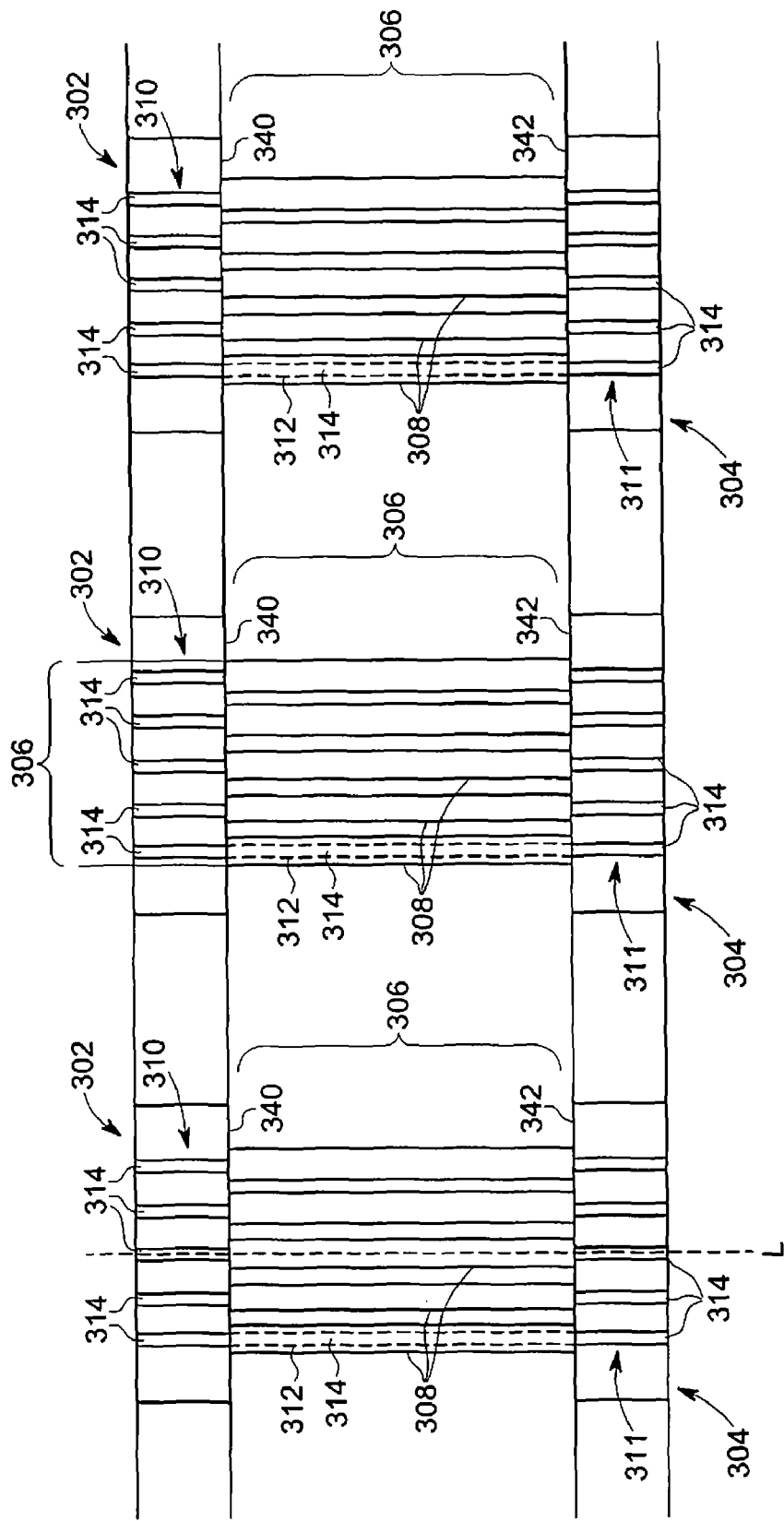
FIG. 3 illustrates details of a portion of a rung of the RF coil in FIG. 2 in accordance with an embodiment.
Figure 4:
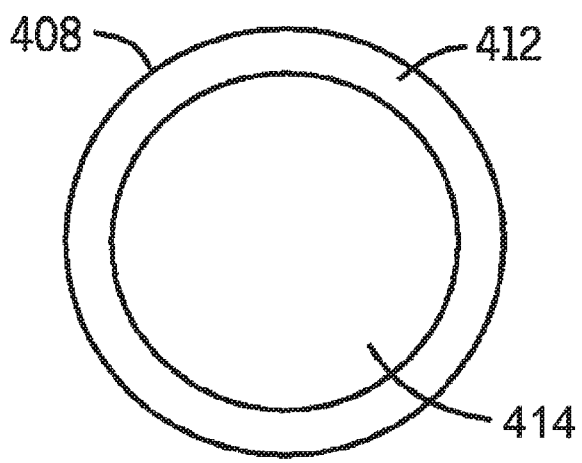
FIG. 4 shows a cross-sectional view of an insulated wire of the rung in FIG. 3 in accordance with an embodiment.

FIG. 3 illustrates details of rungs of the RF coil in FIG. 2 in accordance with an embodiment (illustrating three rungs). A rung 306 includes a plurality of insulated wires 308 positioned parallel to one another along the longitudinal axis (L) of the rung 306. An exemplary number of wires 308 are shown in FIG. 3 for illustration. Different numbers of wires 308 may be used based on the requirements of a particular imaging application. Each insulated wire 308 has a circular cross section as shown in FIG. 4. An insulated wire 408 (308, FIG. 3) is constructed from a wire 414 (314, FIG. 3) composed of a high electrical conductivity material such as copper or silver. Each wire 414 is individually insulated with an insulation material 412 (312, FIG. 3), for example, any high insulation material that can withstand high breakdown voltages. The insulation material 412 is disposed on an outer surface of each wire 414. The diameter of each wire 414 is selected based on the desired frequency to be produced by the RF coil 200 (shown in FIG. 2). For example, lower frequencies require a smaller diameter for each wire 414 and higher frequencies require a larger diameter for each wire 414.

Figure 5:
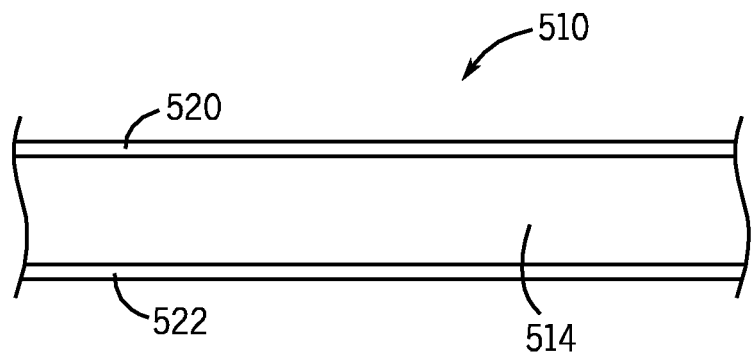
FIG. 5 shows a side view of a section of a rung configured to be connected to an end ring in accordance with an embodiment.
Figure 6:
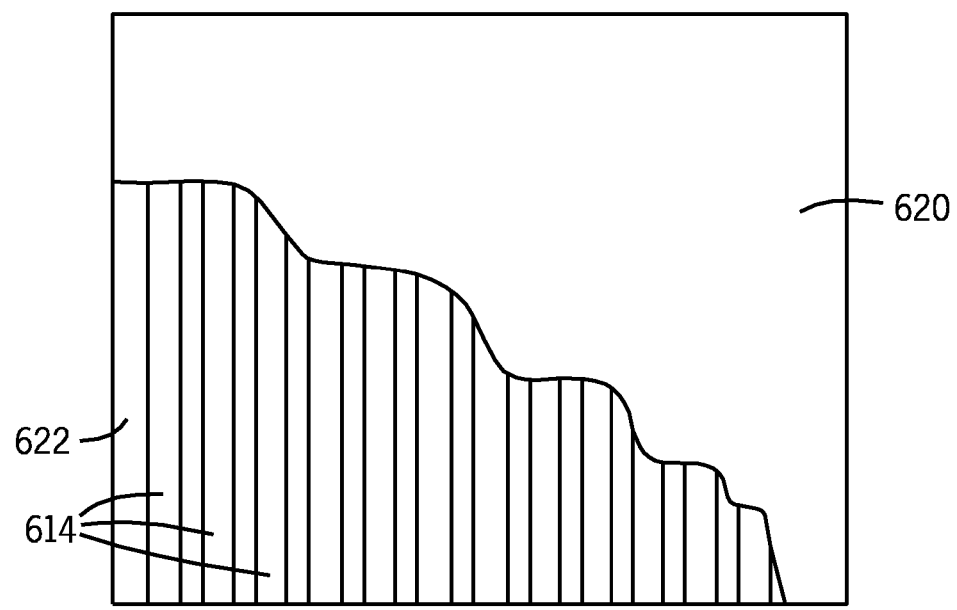
FIG. 6 shows a cutaway top view of a section of a rung configured to be connected to an end ring in accordance with an embodiment.
Figure 7:
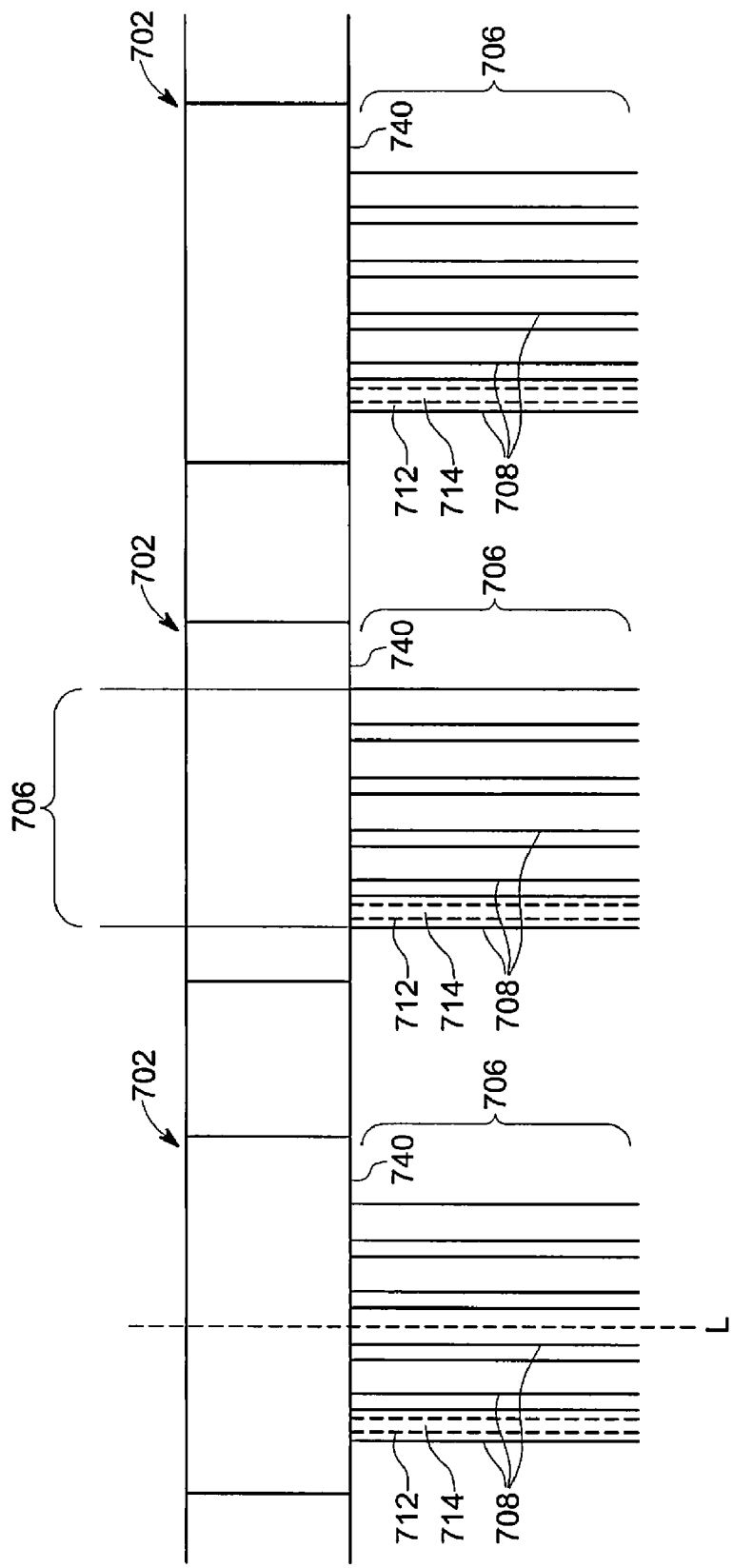
FIG. 7 illustrates details of a portion of a rung of the RF coil in FIG. 2 in accordance with an alternative embodiment

Returning to FIG. 3, the insulated wires 308 are provided between a first end ring 302 (e.g., end ring 202 in FIG. 2) and a second end ring 304 (e.g., end ring 204 shown in FIG. 2). Various methods may be used to connect rung 306 to each end ring 302, 304. In one embodiment, a first end 310 of the rung 306 to be connected to the first end ring 302 includes sections of wire 314 that are un-insulated. Accordingly, the insulation 312 surrounding wires 314 stops at an edge 340 of the end ring 302. In this embodiment, a second end 311 of the rung 306 to be connected to the second end ring 304 includes sections of wire 314 that are un-insulated. Accordingly, the insulation 312 surrounding wires 314 stops at an edge 342 of the end ring 304. In an embodiment, the un-insulated section of wire 314 are disposed between sheets of copper and soldered to appropriate end ring 302, 304. FIG. 5 shows a side view of a section of rung configured to be connected to an end ring in accordance with an embodiment. The un-insulated sections of wire 514 at an end 510 of the rung (306, FIG. 3) are disposed between a first copper sheet 520 and a second copper sheet 522. FIG. 6 shows a cutaway top view of a section of a rung configured to be connected to an end ring in accordance with an embodiment. The un-insulated sections or wire 614 are positioned between a "top" (or first) copper sheet 620 and a "bottom" (or second) copper sheet 622. Returning to FIG. 5, preferably, the first 520 and second 522 copper sheets are thin copper sheets with the a minimal thickness. The copper sheet (for example, second copper sheet 522) can be connected (e.g., by soldering) to an end ring. In another embodiment, a rung can be connected to an end ring by connecting (e.g., soldering) the insulated wires to an edge of the end ring as shown in FIG. 7 illustrating three rungs 706. Accordingly, no portion of wire will overlap the end ring 702 and the ends of the insulated wire 708 of rung 706 that extend along the longitudinal axis (L) of the rung 706 will be connected to the edge 740 of the end ring 702.

Rungs, as described above with respect to FIGS. 3-7, with a plurality of parallel individually insulated circular cross section wires can be used in other coil configurations using rungs (or legs, conductive elements) such as a transverse electromagnetic (TEM) RF coil. In another embodiment, the end rings 202,204 (shown in FIG. 2) are also constructed using a plurality of individually insulated parallel circular cross section wires.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. A radio frequency (RF) coil configured for a magnetic resonance imaging (MRI) system, the RF coil comprising:
   a plurality of rungs, each rung comprising:
      a first end and a second end; and
      a plurality of individual wires within the rung and along a longitudinal axis of the rung, each of the plurality of individual wires being positioned parallel to each of the other wires of the plurality of individual wires, each wire having a circular cross section and each wire having an insulating material disposed around an outside surface of a length of the wire, each of the plurality of wires extending linearly between the first end and the second end of the rung; and
   first and second end rings connected to the first and second ends of the plurality of rungs.

2. An RF coil according to claim 1, wherein the first end of each rung comprises:
   a first copper sheet;
   a second copper sheet; and
   a first section of uninsulated wire positioned between the first copper sheet and the second copper sheet.

3. An RF coil according to claim 2, wherein the second end of each rung comprises:
   a third copper sheet;
   a fourth copper sheet; and
   a second section of uninsulated wire positioned between the third copper sheet and the fourth copper sheet.

4. An RF coil according to claim 1, wherein the RF coil is a birdcage configuration coil.

5. An RF coil according to claim 1, wherein each of the plurality of wires is individually insulated.

6. An RF coil according to claim 1, wherein the RF coil is a transverse electromagnetic (TEM) configuration coil.

7. An RF coil according to claim 1, wherein each wire has a diameter and the diameter is selected based on a desired frequency.

8. An RF coil according to claim 1, wherein each wire is comprised of copper.

9. An RF coil according to claim 1, wherein the RF coil is a whole-body RF coil.

10. An RF coil according to claim 1, wherein the RF coil is a local coil.

11. A resonance assembly configured for a magnetic resonance imaging (MRI) system, the resonance assembly comprising:
    a magnet;
    a gradient coil assembly disposed within an inner diameter of the magnet; and
    a radio frequency (RF) coil disposed within an inner diameter of the gradient coil assembly, the RF coil comprising:
      a plurality of rungs, each rung comprising:
        a first end and a second end; and
        a plurality of individual wires within the rung and along a longitudinal axis of the rung, each of the plurality of individual wires being positioned parallel to each of the other wires of the plurality of individual wires, each wire having a circular cross section and each wire having an insulating material disposed around an outside surface of a length of the wire, each of the plurality of wires extending linearly between the first end and the second end of the rung; and
      first and second end rings connected to the first and second ends of the plurality of rungs.

12. A resonance assembly according to claim 11, wherein the first end of each rung comprises:
    a first copper sheet;
    a second copper sheet; and
    a first section of uninsulated wire positioned between the first copper sheet and the second copper sheet.

13. A resonance assembly according to claim 12, wherein the second end of each rung comprises:
    a third copper sheet;
    a fourth copper sheet; and
    a second section of uninsulated wire positioned between the third copper sheet and the fourth copper sheet.

14. A resonance assembly according to claim 11, wherein the RF coil is a birdcage configuration coil.

15. A resonance assembly according to claim 11, wherein the RF coil is a local coil.

16. A resonance assembly according to claim 11, wherein the RF coil is a transverse electromagnetic (TEM) configuration coil.

17. A resonance assembly according to claim 11, wherein each wire has a diameter and the diameter is selected based on a desired frequency.

18. A resonance assembly according to claim 11, wherein each wire is comprised of copper.

19. A resonance assembly according to claim 11, wherein the RF coil is a whole-body RF coil.

\* \* \* \* \*